(12) United States Patent
Ogura

(10) Patent No.: US 6,643,172 B2
(45) Date of Patent: Nov. 4, 2003

(54) BIT LINE DECODING SCHEME AND CIRCUIT FOR DUAL BIT MEMORY WITH A DUAL BIT SELECTION

(75) Inventor: Tomoko Ogura, Hopewell Jct, NY (US)

(73) Assignee: Halo LSI, Inc., Wappingers Falls, NY (US)

( * ) Notice: Subject to any disclaimer, the term of this patent is extended or adjusted under 35 U.S.C. 154(b) by 0 days.

(21) Appl. No.: 10/190,633

(22) Filed: Jul. 8, 2002

(65) Prior Publication Data

US 2003/0031048 A1 Feb. 13, 2003

Related U.S. Application Data

(60) Provisional application No. 60/303,735, filed on Jul. 6, 2001.

(51) Int. Cl.[7] ............................................... G11C 16/04
(52) U.S. Cl. ........................ 365/185.03; 365/185.25; 365/230.06
(58) Field of Search .................... 365/185.03, 185.23, 365/185.18, 230.06, 203, 185.21, 185.33

(56) References Cited

U.S. PATENT DOCUMENTS

| 6,011,725 A | 1/2000 | Eitan ..................... 365/185.33 |
| 6,181,597 B1 * | 1/2001 | Nachumovsky ........ 365/185.03 |
| 6,248,633 B1 | 6/2001 | Ogura et al. ............... 438/267 |
| 6,459,622 B1 | 10/2002 | Ogura et al. .......... 365/185.28 |
| 6,469,935 B2 | 10/2002 | Hayashi ................. 365/185.18 |

* cited by examiner

*Primary Examiner*—David Lam
(74) *Attorney, Agent, or Firm*—George O. Saile; Stephen B. Ackerman

(57) ABSTRACT

In the present invention a bit line decoder scheme is described that connects data and voltage to a plurality of bit lines of a dual bit flash memory array. The bit lines are connected to a plurality of intermediate data lines by a first decoder unit and the intermediate data lines are connected to a plurality of data lines of the sense amplifiers by a second decoder unit. In one embodiment the voltage is connected to a selected bit line through a separate decoder unit and in a second embodiment the voltage is connected through the decoder unit connected to the intermediate data lines.

20 Claims, 4 Drawing Sheets

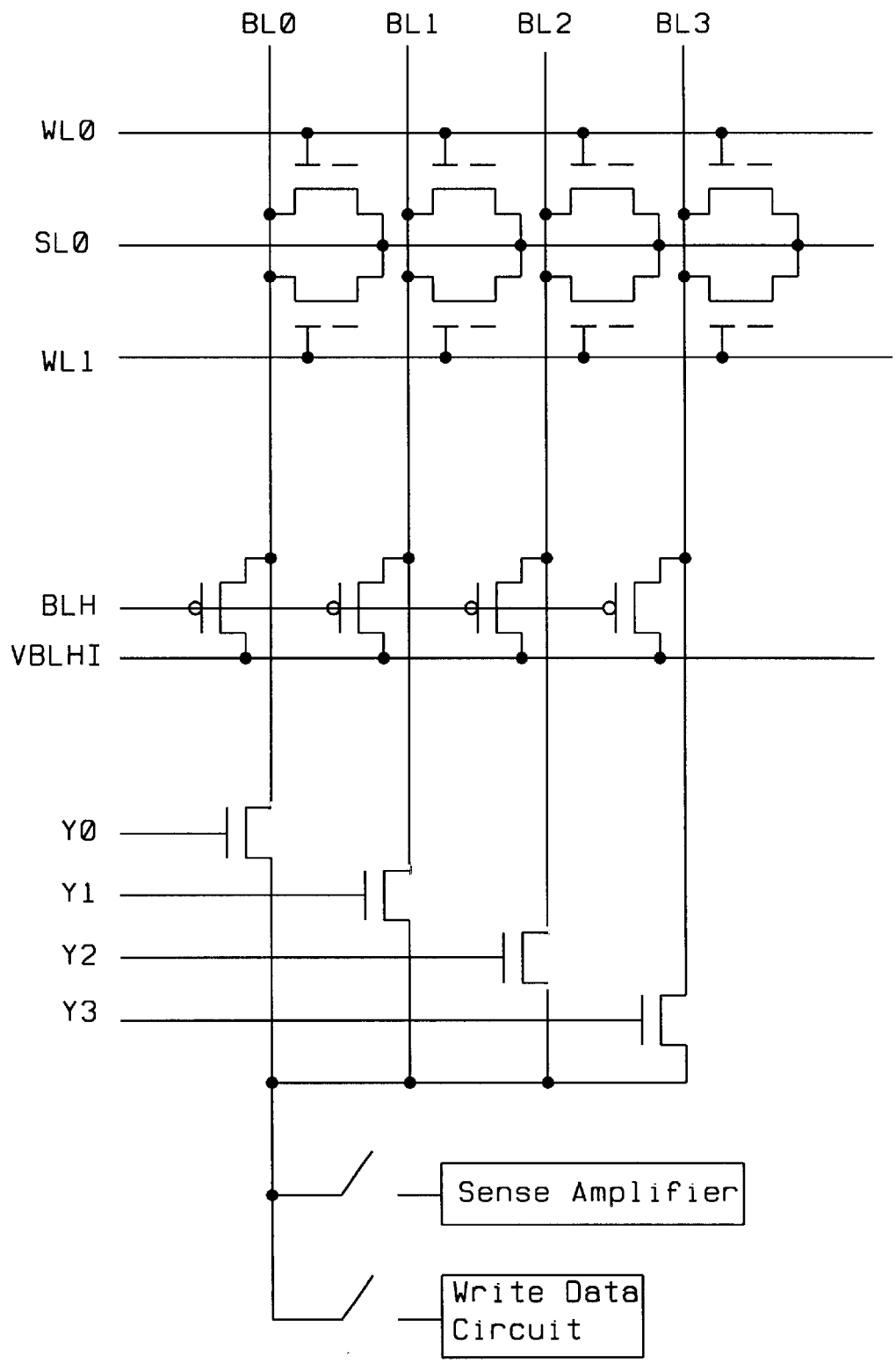
FIG. 1 – Prior Art

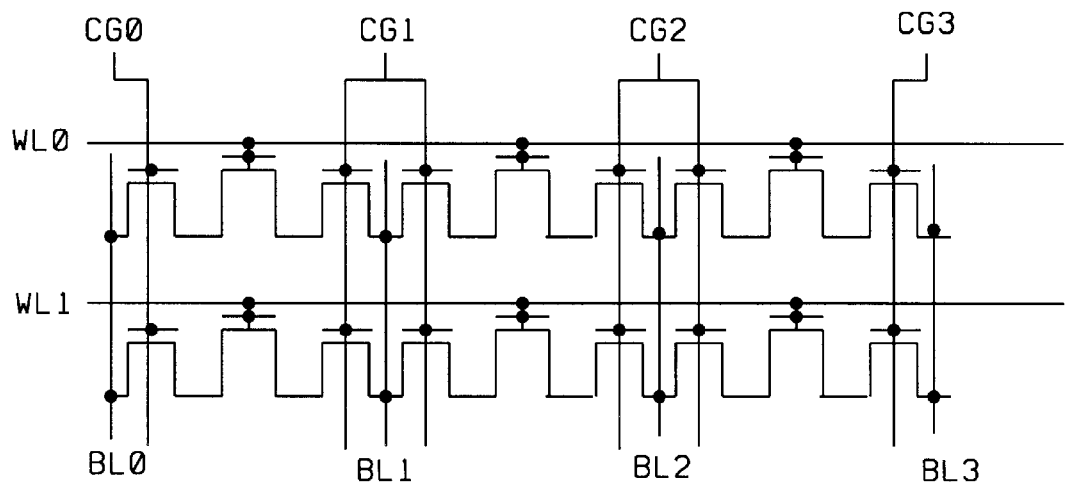
*FIG. 2 - Prior Art*
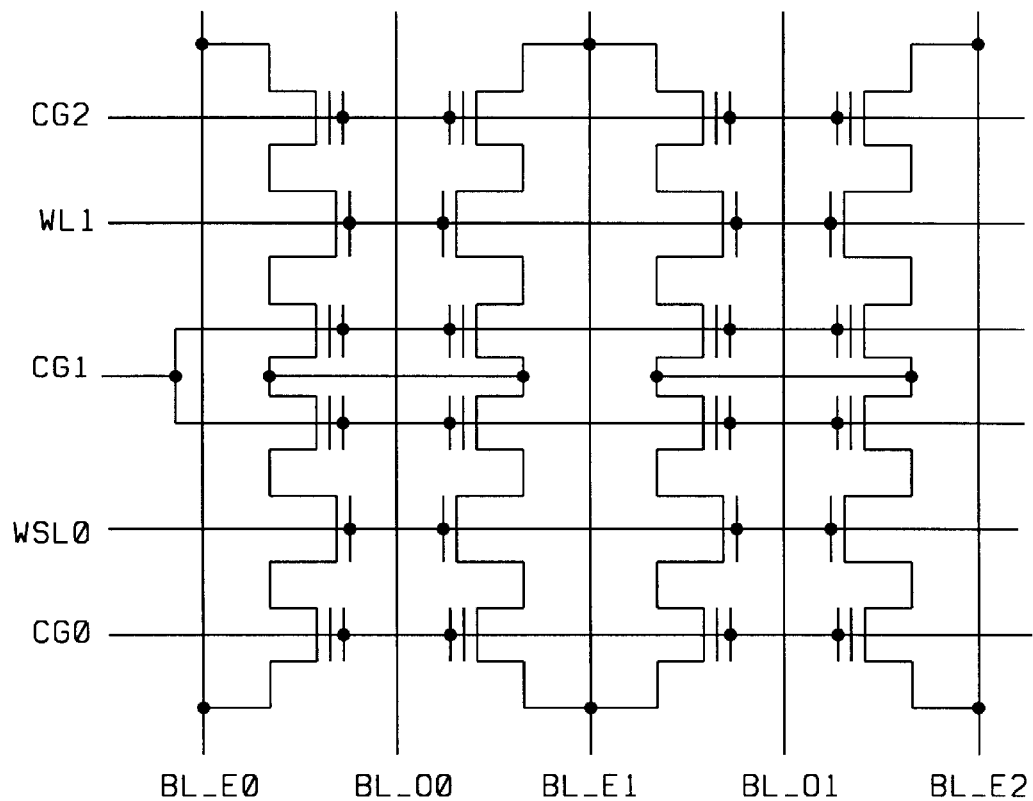
*FIG. 3 - Prior Art*

US 6,643,172 B2

BIT LINE DECODING SCHEME AND CIRCUIT FOR DUAL BIT MEMORY WITH A DUAL BIT SELECTION

This application claims priority to Provisional Patent Application serial No. 60/303,735, filed on Jul. 6, 2001, which is herein incorporated by reference.

BACKGROUND OF THE INVENTION

1. Field of Invention

The present invention relates semiconductor memories and in particular flash memories using dual bit flash memory cells.

2. Description of Related Art

Bit line decoding is a common component to all types of DRAM, SRAM and flash memory arrays. Smaller chip area means lower cost; and therefore, as many memory cells are packed into a small space as possible. However, the sensing circuitry, which determines the value of the memory cell, may require significant area. This is one of the reasons that a single sensing circuit is usually shared between many memory cells in order to reduce cost. The function of a bit line decoder is to select the correct bit line and connect it to a corresponding sense amplifier.

FIG. 1 shows a conventional bit line decoder connected to a NOR-type floating gate flash memory array. It should be noted that for the NOR-type array, each memory cell column has a unique bit line, and the source diffusions of the memory cells are connected horizontally through the array.

FIG. 2 shows a higher density dual-bit type array, in which the source lines are combined with the bit lines and run vertically. U.S. Pat. No. 6,011,725 (Eitan) and patent application Ser. No. 09/426,692 filed Oct. 25, 1999 describe different types of dual-bit memory arrays. The basic commonality between them is that a single word line and one bit line is shared between two hard-bits (left and right of each word gate). For a single hard-bit operation, two bit lines are needed to be selected at the same time. One will provide the source voltage and the other will provide the drain voltage, depending on whether the left or right hand bit is selected. Thus, it can be seen that the bit line decoder for a dual bit array needs to be more complex than the NOR-type decoder.

In U.S. Pat. No. 6,011,725 (Eitan), a single hard bit storage site is selected for operations. Care and consideration is taken to ensure that the unselected hard bit storage site sharing the same bit line does not experience undue disturb effects. In patent application Ser. No. 10/099,030 filed Mar. 15, 2002, a new memory cell selection is introduced. Instead of selecting two bit lines for one hard-bit, three bit lines are selected for two hard bits. By selecting the two hard bit storage sites simultaneously, disturb effects can be reduced. Also bit line decode is greatly simplified because hard bits are selected as pairs and there is no longer a need to differentiate between the left and right bits.

In patent application Ser. No. 09/810,122 filed Mar. 19, 2001 another type of dual bit flash memory cell array with a metal bit line is described, shown in FIG. 3. Although the cell area is slightly larger, the process is simpler than the diffusion bit line array. Instead of having a diffusion bit line, a single diffusion to a metal contact is shared between four hard bits, which lowers the bit line resistance. Control gates run parallel to the word line, and bit lines run orthogonal to both the control lines and the word lines. Bit line selection depends on both the y column address as well as an odd or even designation of the CG line

SUMMARY OF THE INVENTION

It is an objective of the present invention is to provide a bit line decoder scheme that selects one memory cell containing two storage sites in an array of dual bit memory cells.

It is another objective of the present invention to use the bit line decoder scheme with both the diffusion bit line MONOS and the metal bit line MONOS arrays.

It is still another objective of the present invention to provide a bit line decoder circuit, which incorporates the voltage selection requirements for a dual bit memory array.

It is yet another objective of the present invention to selectively connect bit lines to a voltage source through decoding transistors.

It is further an objective of the present invention to selectively connect two bit lines to two intermediate data lines and selectively connect the intermediate data lines to sense amplifiers through decoding transistors.

It is still further an objective of the present invention to reduce the number of signals produced by the decoder logic by incorporating the voltage selection requirements for the dual bit memory array by a third intermediate data line.

In the present invention a bit line decoder scheme is described in which one memory cell containing two storage sites is selected from an array of flash memory cells each containing two storage sites. In a first embodiment a first decoding unit comprises transistors that connect bit lines to a voltage source. The bit lines function both as source lines and as drain lines to the memory cells. A second decoding unit comprises transistors that selectively connect the bit lines of the flash memory array to intermediate data lines. A third decoder unit comprises transistors that connect the intermediate data lines to the memory sense amplifiers. This allows a memory storage site to be connected to each of two sense amplifiers simultaneously while a bias voltage is selectively applied the bit lines of the memory array.

In the second embodiment reduces by one the number of decoding units in comparison to the first embodiment. A first decoding unit comprises transistors that selectively connect the bit lines of a flash memory array containing cells with two storage sites to intermediate data lines. The intermediated data lines are connected to sense amplifiers by a second decoding unit. The second decoding unit is also used to connect a voltage to a third intermediate data line in which the voltage is selectively connected to the bit lines through the first decoding unit.

BRIEF DESCRIPTION OF THE DRAWINGS

This invention will be described with reference to the accompanying drawings, wherein:

FIG. 1 shows schematic of prior art of a conventional bit line decoder connected to a NOR-type flash memory array, FIG. 2 shows a schematic of prior art of a dual-bit type flash memory array where bit line and source lines run in a vertical direction, FIG. 3 shows a schematic of prior art of a dual bit flash memory cell array with a metal bit line.

DETAILED DESCRIPTION OF THE PREFERRED EMBODIMENT

Figure 4:
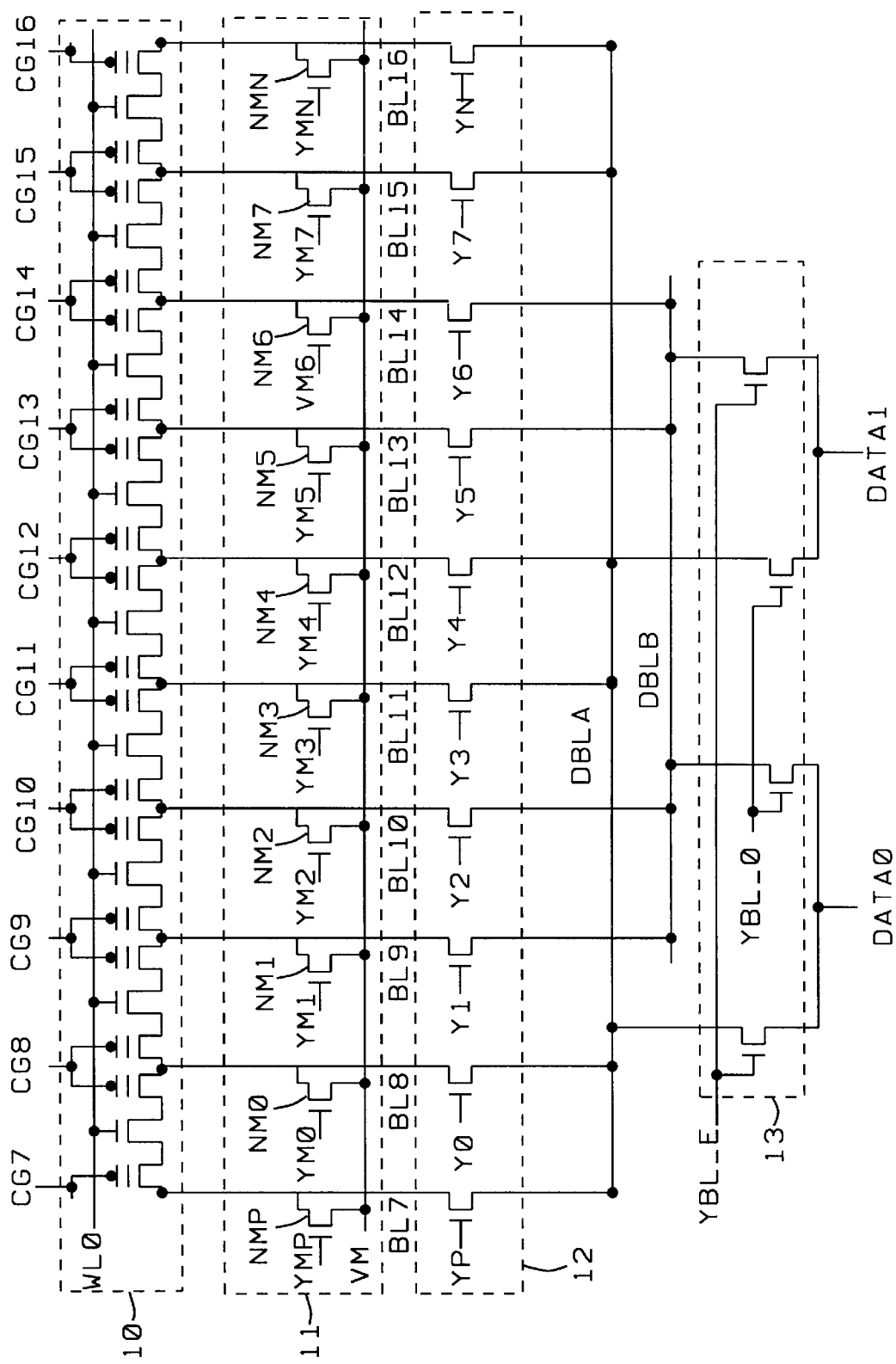
FIG. 4 shows a schematic diagram of the decoder scheme of the first embodiment of the present invention.

FIG. 4 shows a schematic diagram of the first embodiment of the present invention. A portion of a page of dual bit flash memory cells 10 is connected to a word line WL0, bit lines BL7 through BL16 and control gate lines CG7 through CG16. A first decoding unit 11 connects a voltage VM to the bit lines. The transistors of the first decoding unit include transistors NM0 through NM7 with decoder inputs YM0 through YM7, NMP (previous) with decoder input YMP and NMN (next) with decoder input YMN. A second decoding unit 12 connects the bit lines BL7 through BL16 to intermediate data lines DBLA and DBLB. The input to transistors of the second decoding unit comprises decoder inputs Y0 through Y7, YP (previous) and YN (next). A third decoding unit 13 connects the intermediate data lines DBLA and DBLB to sense amplifiers through DATA0 and DATA1 using decoder inputs YBL_E and YBL_O.

The bit line decoder circuit shown in FIG. 4 incorporates a voltage selection requirement for the dual bit memory array, and can choose one memory cell from a number nbl of memory cells 10. Bit lines are denoted as BLn, where n is also the memory cell number. Because the memory cells have two storage sites, it is necessary for the decoder circuit to connect to nbl+2 bit lines to select from the nbl memory cells. The far left bit line is designated BL(nbl−1), or BL7, and the far right bit line is BL(nbl+1), or BL16 as shown in FIG. 4. There are three types of decoding units 11, 12 and 13, and depending on the required and available voltages in the system, a decoding unit may be implemented as a high voltage NMOS transistor or a complementary transmission pass gate comprised of one NMOS and one PMOS transistor. If the space is not of primary concern, then the complementary gate NMOS and PMOS transistors should be used for a decoder unit.

Table 1 describes the decoder logic for the decoder circuits in FIG. 4 for read and program modes in which two bit lines will be selected at the same time. The middle bit line will be connected to voltage source VM, and the outside two bit lines will be connected to two sense amplifiers and program latches. Therefore, when K modulo Y=0, transistor NM0 is turned on by a decoder input YM0 to connect VM to bit line BL8, YM[#]=0 for decoder unit 11; bit line BL7 is connected to the intermediate data line DBLA, Y[#]=P for decoder unit 12; bit line BL9 is connected to the intermediate data line DBLB, Y[#]=1 for decoder unit 12; and for decoder unit 13 the decoder signal YBL_E connects DBLA to DATA0 and DBLB to DATA1. When K modulo Y=2, transistor NM2 is turned on by a decoder input YM2 to connect VM to bit line BL10, YM[#]=2 for decoder unit 11; bit line BL9 is connected to the intermediate data line DBLA, Y[#]=1 for decoder unit 12; bit line BL11 is connected to the intermediate data line DBLB, Y[#]=3 for decoder unit 12; and for decoder unit 13 the decoder signal YBL_O connects DBLA to DATA1 and DBLB to DATA0.

TABLE 1

| K modulo Y | Unit 11 YM[#] | Unit 12 Y[#] | Unit 12 Y[#] | Unit 13 YBL- |
|---|---|---|---|---|
| 0 | 0 | P | 1 | EV |
| 1 | 1 | 0 | 2 | EV |
| 2 | 2 | 1 | 3 | OD |
| — | — | — | — | — |
| — | — | — | — | — |
| Y-1 | Y-1 | Y-2 | Y | OD |
| Y | Y | Y-1 | N | OD |

Figure 5:
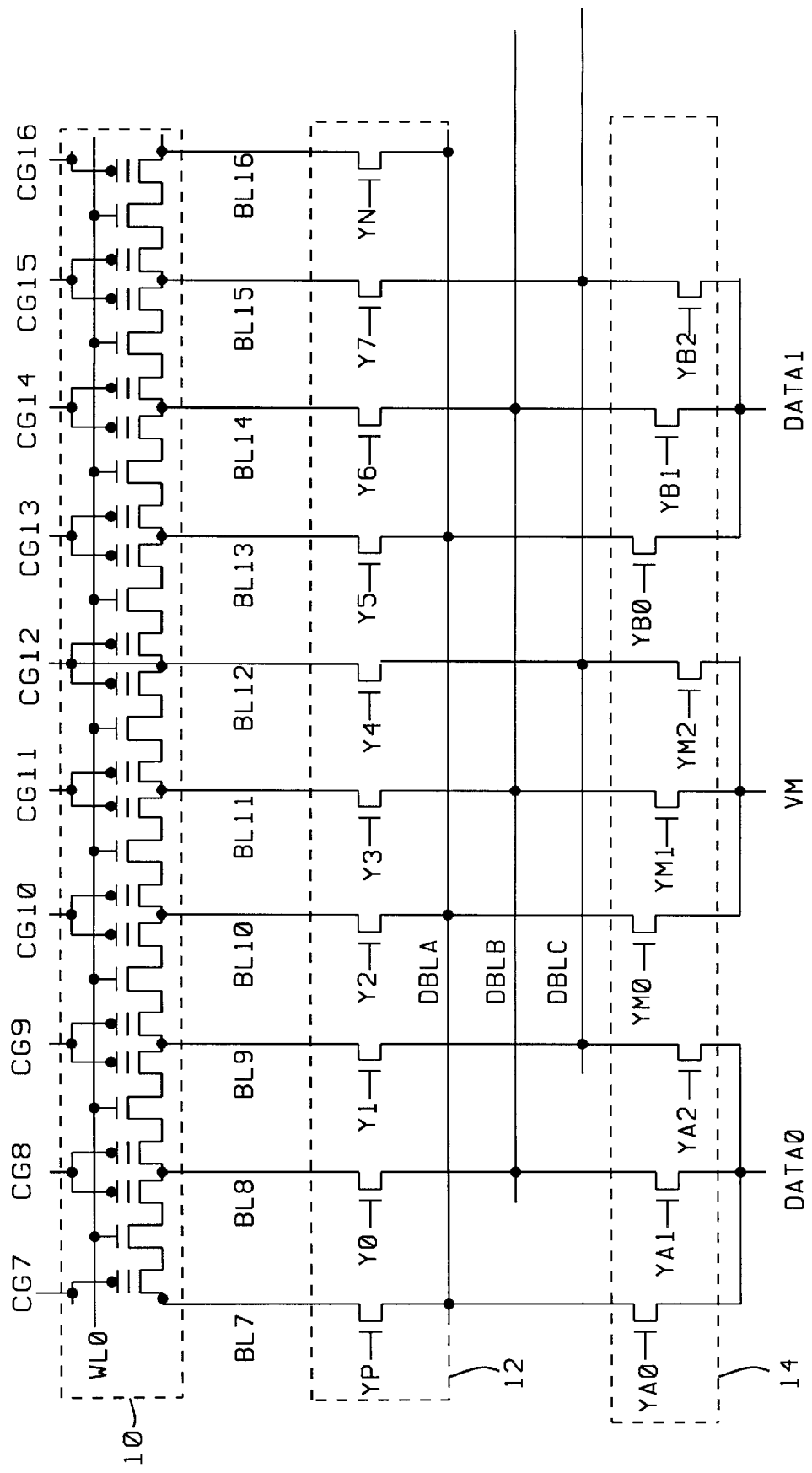
FIG. 5 shows a schematic diagram of the decoder scheme of the second embodiment of the present invention.

FIG. 5 shows a schematic diagram of the second embodiment of the present invention where a variation of the bit line decoder circuit has the same function as that of FIG. 4. The advantage of this circuit is that the decoder unit 11 of FIG. 4 has been eliminated to reduce the number of signals that need to be generated by the decoder logic. Instead, a third intermediate data line DBLC has been added and the VM voltage selection function is incorporated in the decoder unit 14. The decoders in both FIG. 4 and FIG. 5 can be used on the diffusion bit lines for a dual bit MONOS array and the metal bit lines for a dual bit MONOS array. However, the logic of the decoders will be different.

Continuing to refer to FIG. 5, a portion of a page of dual bit flash memory cells 10 is connected to a word line WL0, bit lines BL7 through BL16 and control gate lines CG7 through CG16. A first decoding unit 12 connects the bit lines BL7 through BL16 to intermediate data lines DBLA, DBLB and DBLC. The input to transistors of the first decoding unit 10 comprises decoder inputs Y0 through Y7, YP (previous) and YN (next). A second decoding unit 14 connects the intermediate data lines DBLA DBLB and DBLC to sense amplifiers through DATA0 using decoder inputs YA0, YA1 and YA2 and DATA1 using decoder inputs YB0, YB1 and YB2. The second decoding unit 14 also connects a voltage VM to the intermediate data lines DBLA, DBLB and DBLC using decoder inputs YM0, YM1 and YM2.

The bit line decoder circuit shown in FIG. 5 incorporates a voltage selection requirement for the dual bit memory array into the second decoder unit 14, and can choose one memory cell from a number nbl of memory cells 10. Bit lines are denoted as BLn, where n is also the memory cell number. Because the memory cells have two storage sites, it is necessary for the decoder circuit to connect to nbl+2 bit lines to select from the nbl memory cells. The far left bit line is designated BL(nbl−1), or BL7, and the far right bit line is BL(nbl+1), or BL16 as shown in FIG. 5. There are two decoding units 12 and 14, and depending on the required and available voltages in the system, a decoding unit may be implemented as a high voltage NMOS transistor or a complementary transmission pass gate comprised of one NMOS and one PMOS transistor. If the space is not of primary concern, then the complementary gate NMOS and PMOS transistors should be used for a decoder unit.

Table 2 describes the decoder logic for the decoder circuits in FIG. 5 for read and program modes in which two bit lines will be selected at the same time. The middle bit line will be connected to voltage source VM, and the outside two bit lines will be connected to two sense amplifiers and program latches. Therefore, when K modulo Y=0, decoder input Y0 connects BL8 to DBLB which is further connected to a voltage VM by decoder input YM1 in decoder unit 14; bit line 7 is connected to intermediate data line DBLA, Y[#]=P for decoder unit 12; and bit line BL9 is connected to the intermediate data line DBLC, Y[#]=1 for decoder unit 12. Decoder input YA0 connects intermediate data line DBLA to data line DATA0, and decoder input YB2 connects intermediate data line DBLC to data line DATA1. Thus bit line BL7 is connected to DATA0, bit line BL9 is connected to DATA1 and bit line BL8 is connected to a voltage VM. When K modulo Y=2, decoder input Y1 connects BL9 to DBLC which is further connected to a voltage VM by decoder input YM2 in decoder unit 14; bit line 8 is connected to intermediate data line DBLb, Y[#]=0 for decoder unit 12; and bit line BL10 is connected to the intermediate data line DBLA, Y[#]=2 for decoder unit 12. Decoder input YA1 connects intermediate data line DBLB to data line DATA0, and decoder input YB0 connects intermediate data line DBLA to data line DATA1. Thus for K modulo Y=2, bit line BL8 is connected to DATA0, bit line BL10 is connected to DATA1 and bit line BL9 is connected to a voltage VM.

TABLE 2

| K modulo Y | Unit 12 | | | Unit 14 | | |
|---|---|---|---|---|---|---|
| | Y[#] | Y[#] | Y[#] | YA[#] | YM[#] | YB[#] |
| 0 | 0 | P | 1 | 0 | 1 | 2 |
| 1 | 1 | 0 | 2 | 1 | 2 | 0 |
| 2 | 2 | 1 | 3 | 2 | 0 | 1 |
| 3 | 3 | 2 | 0 | 0 | 1 | 2 |
| 4 | 0 | 3 | 1 | 1 | 2 | 0 |

For the metal bit array, the same topographical decoder circuit may be used, but the decoder logic is different because the bit lines are labeled differently. There is an even/odd property to the bit lines based on the control gate selection. If an odd bit line is selected, then the two even bit lines next to it will also be selected together.

While the invention has been particularly shown and described with reference to preferred embodiments thereof, it will be understood by those skilled in the art that various changes in form and details may be made without departing from the spirit and scope of the invention.

What is claimed is:

1. A bit line decoder circuit for a flash memory array with dual bit cells, comprising:
   a) a flash memory array with a plurality of dual bit memory cells,
   b) a first decoder unit connecting a voltage to bit lines of said memory array,
   c) said bit lines function both as source lines and as drain lines,
   d) a second decoder unit connecting said bit lines to a plurality of intermediate data lines,
   e) a third decoder unit connecting said plurality of intermediate data lines to a plurality of data lines connected to a plurality of sense amplifiers.

2. The bit line decoder circuit of claim 1, wherein said first decoder unit connects said voltage to said bit line operating as said source line for selected adjacent memory cells.

3. The bit line decoder circuit of claim 1, wherein said second decoder unit connects to a plurality of bit lines plus two bit lines to select from said plurality of memory cells.

4. The bit line decoder circuit of claim 1, wherein said third decoder unit selects from said intermediate data lines to provide simultaneous data to said plurality of sense amplifiers.

5. The bit line decoder circuit of claim 1, wherein said bit lines are diffusion bit lines in a dual bit MONOS array.

6. The bit line decoder circuit of claim 1, wherein said bit lines are metal bit lines in a dual bit MONOS array.

7. A bit line decoder circuit for a dual bit flash memory array, comprising:
   a) a flash memory array with a plurality of dual bit memory cells connected to bit lines, control gate lines and word lines,
   b) said bit lines function both as source lines and as drain lines,
   c) a first decoder unit connecting said bit lines to a plurality of intermediate data lines,
   d) a second decoder unit connecting said plurality of intermediate data lines to a voltage and to a plurality of data lines connected to a plurality of sense amplifiers.

8. The bit line decoder circuit of claim 7, wherein said first decoder unit connects to a plurality of bit lines plus two bit lines to select from said plurality of memory cells.

9. The bit line decoder circuit of claim 7, wherein said second decoder unit selects from said intermediate data lines to provide simultaneous data to said plurality of sense amplifiers.

10. The bit line decoder circuit of claim 7, wherein said second decoder unit connects said voltage to one of said plurality of intermediate data lines and said first decoder unit connects said one of said plurality of intermediate data lines to the bit line operating as the source line for selected adjacent memory cells.

11. The bit line decoder circuit of claim 7, wherein said bit lines are diffusion bit lines in a dual bit MONOS array.

12. The bit line decoder circuit of claim 7, wherein said bit lines are metal bit lines in a dual bit MONOS array.

13. A means for connecting to bit lines of a dual bit flash memory array for read and program operations, comprising:
   a) a means for selecting a plurality of bit lines of a dual bit flash memory array,
   b) a means for connecting a voltage to said plurality of bit lines operating as source lines,
   c) a means for connecting said plurality of bit lines to be read or programmed to a plurality of sense amplifiers.

14. The means of claim 13, wherein the means for connecting a voltage to said plurality of bit lines operating as source lines uses a decoder means to connect said voltage to said bit lines.

15. The means of claim 13, wherein the means for connecting a voltage to said plurality of bit lines operating as source lines further comprises a first decoder means to connect said intermediate data lines to said bit lines and a second decoder means to connect said voltage to intermediate data lines.

16. The means of claim 13, wherein the means for connecting said plurality of bit lines to be read or programmed to a plurality of sense amplifiers further comprises a first decoder means to connect said plurality of bit lines to a plurality of intermediate data lines and a second decoder means to connect said plurality of intermediate data lines to said plurality of sense amplifiers.

17. A method of selecting bit lines of a dual bit flash memory array for read and program operations, comprising:
   a) connecting a voltage to one of a plurality of intermediate data lines,
   b) connecting a plurality of sense amplifiers to said plurality of intermediate data lines,
   c) selecting a plurality of bit lines to be connected to said plurality of intermediate data lines.

18. The method of claim 17, wherein said voltage source is connected to said bit lines directly through a decoder unit.

19. The method of claim 17, wherein connecting said plurality of sense amplifiers to said plurality of intermediate data lines is through a decoder unit not connected to said voltage.

20. The method of claim 17, wherein selecting said plurality of bit lines to be connected to said plurality of intermediated data lines is through a decoder unit that connects both data and voltage to said plurality of bit lines.

* * * * *